(12) United States Patent
Burger

(10) Patent No.: US 8,487,616 B2
(45) Date of Patent: Jul. 16, 2013

(54) METHOD FOR COMPENSATING FOR RESPIRATORY MOTION IN MAGNETIC RESONANCE IMAGING

(75) Inventor: Ian Hamilton Burger, Stellenbosch (ZA)

(73) Assignee: University of Cape Town (ZA)

( * ) Notice: Subject to any disclaimer, the term of this patent is extended or adjusted under 35 U.S.C. 154(b) by 0 days.

(21) Appl. No.: 13/580,640

(22) PCT Filed: Feb. 22, 2011

(86) PCT No.: PCT/IB2011/000345
§ 371 (c)(1),
(2), (4) Date: Aug. 22, 2012

(87) PCT Pub. No.: WO2011/104605
PCT Pub. Date: Sep. 1, 2011

(65) Prior Publication Data
US 2012/0319685 A1 Dec. 20, 2012

(30) Foreign Application Priority Data

Feb. 23, 2010 (ZA) .................................. 2010/01281

(51) Int. Cl.
*G01V 3/00* (2006.01)
(52) U.S. Cl.
USPC .......................................................... 324/309
(58) Field of Classification Search
USPC ................................................. 324/300–322
See application file for complete search history.

(56) References Cited

U.S. PATENT DOCUMENTS

| 6,184,682 | B1 | 2/2001 | Ehman et al. | |
|---|---|---|---|---|
| 7,561,909 | B1 | 7/2009 | Pai et al. | |
| 7,834,623 | B2 | 11/2010 | Iwadate et al. | |
| 2003/0065272 | A1* | 4/2003 | Hillsman | 600/529 |
| 2006/0183999 | A1* | 8/2006 | Lorenz et al. | 600/410 |
| 2007/0001674 | A1 | 1/2007 | Purdy | |
| 2007/0244386 | A1* | 10/2007 | Steckner et al. | 600/411 |
| 2011/0038520 | A1 | 2/2011 | Yui | |

FOREIGN PATENT DOCUMENTS

| EP | 1113288 B1 | 3/2006 |
|---|---|---|
| WO | WO01/84172 A1 | 11/2001 |
| WO | 2008/155738 A2 | 12/2008 |

OTHER PUBLICATIONS

Vedam, et al., Predicting respiratory motion for four-dimensional radiotherapy, Med. Phys. 31(8), pp. 2274-2283, 2004.*

(Continued)

*Primary Examiner* — Melissa Koval
*Assistant Examiner* — Daniel Miller
(74) *Attorney, Agent, or Firm* — Bozicevic, Field & Francis LLP; Bret E. Field; Daniel G. Stoddard

(57) ABSTRACT

A method for compensating for respiratory motion of a structure imaged by a magnetic resonance (MR) scanner, such as heart, is disclosed. The method comprises obtaining a sequence of navigator samples (22) representative of the progressive displacement of the structure during a first time interval (20), and adjusting a waveform (14) of predefined initial parameters to follow the sequence of navigator samples. During a second time interval (24) which follows the first time interval and during which the magnetic resonance scanner takes a number of image projection views or lines (17), the expected respiratory displacement of the structure is estimated at the times that the image projection lines are taken, by extrapolating the waveform model and estimating the displacements (26) predicted by the extrapolated waveform, so that the position at which the image projection lines are taken can be adjusted to compensate for the respiratory motion, so as to yield a sharper magnetic resonance image.

7 Claims, 7 Drawing Sheets

OTHER PUBLICATIONS

Franklin, et al., Digital Control of Dynamic Systems, 2nd ed., chapter 6, section 6.3, pp. 250-255, Addison-Wesley Publishing Co., 1994.*

Dirk Manke et. al., "Novel Prospective Respiratory Motion Correction Approach for Free-Breathing Coronary MR Angiography Using a Patient-Adapted Affine Motion Model", Magnetic Resonance in Medicine, Wiley InterScience, 2003, vol. 50, pp. 122-131.

* cited by examiner

METHOD FOR COMPENSATING FOR RESPIRATORY MOTION IN MAGNETIC RESONANCE IMAGING

FIELD OF THE INVENTION

This invention relates to motion compensation in magnetic resonance imaging and, more specifically, to a method for compensating for respiratory motion in magnetic resonance imaging of structures affected by such motion, such as structures within a chest cavity of a subject, and especially structures within the chest cavity also affected by other cyclic or regular motion, such as the heart.

BACKGROUND TO THE INVENTION

Magnetic resonance imaging (MRI) relies on the excitation and relaxation of sub-atomic particles within the structure being imaged, and is an important technology for imaging soft tissue in humans and animals. The inherent relaxation time of the tissue being imaged, however, imposes a limit on the speed at which imaging can take place. Typically, each 2D image (called a "slice") is built up from several hundred image projection views or lines, which (depending on the required resolution) can each take between 3 to 6 milliseconds to complete. Often, a three dimensional image composed of multiple slices is required. Constructing an MR image is therefore a process that can take several minutes to complete.

In cardiac MRI, the lines in each slice must be acquired over several heartbeats at the same point in the cardiac cycle. Image acquisition is therefore gated using an electrocardiogram ("ECG") trigger signal, and lines can only be acquired during a short period in each cardiac cycle that the heart is stationary. This short imaging period is referred to as a "segment", and is generally about 200 ms long in a healthy subject with a resting heart rate of about 70 beats per minutes. Echo spacing refers to the time required to obtain a single view line which, as previously mentioned, is about 3 to 6 milliseconds. Allowing for 30-50 ms for scanner preparation before acquisition, about 25 lines can therefore be obtained per 200 ms imaging segment. For a single high resolution slice of 500 lines, about 20 cardiac cycles of scanning time is needed. Obtaining a high resolution MR image of the heart therefore requires appreciably more time than imaging other soft tissue.

Respiration-induced motion of the heart is a particular problem for high resolution cardiac MR imaging. As the imaging spans several heartbeats, the subject's breathing can cause blurring of the acquired image due to the displacement of the heart within the chest cavity as the subject inhales and exhales.

One technique that is employed to overcome this problem is for a subject to hold his or her breath for an appropriate interval of time. However, patients with heart problems may experience tremendous discomfort and difficulty holding their breath for the appropriate periods of time, such as for 20 heartbeats. Where more than one breath-hold is required to complete a slice the position at which the patient holds their breath is rarely identical.

Techniques that allow normal or quiet breathing generally involve the use of navigator signals. A navigator signal is a scanning sequence made by the MR scanner prior to each segment, which involves the excitation of a narrow line across a structure affected by the respiration. Typically, the navigator sequence is made across the right hemi diaphragm. The high contrast been the lung and the liver above and below the diaphragm allows easy detection of the position of the diaphragm, and the position of the heart can be accurately estimated based on the position of the diaphragm.

One technique for compensating for respiratory motion using navigator signals is called the "accept-reject algorithm", in which segments are only taken when the diaphragm is in a certain position, usually within a 5 mm window of acceptance. The drawback of this technique is that it further reduces the time available in which segments can be acquired, leading to very long imaging times.

Another technique, called the "gate and follow" approach, uses the navigator position immediately prior to the imaging segment to correct the positions of the lines made throughout the segment. However, in cases where the subject's breathing causes respiratory motion of the heart during the segment, the navigator data becomes out-dated as the segment duration increases, resulting in images that are not sharp enough. The gate and follow approach is generally not used for this reason.

OBJECT OF THE INVENTION

It is an object of this invention to provide a method for compensating for respiratory motion in magnetic resonance imaging which allows a subject to breathe normally during imaging and which, at least partially, overcomes some of the difficulties mentioned above.

SUMMARY OF THE INVENTION

In accordance with the invention there is provided a method for compensating for respiration-induced motion of a structure imaged by a magnetic resonance scanner, comprising the steps of:
  in a first time interval:
    obtaining from the magnetic resonance scanner a sequence of navigator samples representative of the progressive displacement of the structure; and
    adjusting a waveform model of predefined initial parameters to follow the sequence of navigator samples;
  in a second time interval which follows the first time interval and during which the magnetic resonance scanner takes an imaging segment composed of a number of image projection views or lines:
    estimating the expected displacement of the structure at the times at which at least some of the image projection lines are taken by extrapolating the waveform model and estimating the displacements predicted by the extrapolated waveform model; and
    adjusting the position at which at least some of the image projection lines are taken based on the estimated displacement of the structure at the time that those image projection lines are taken.

Further features of the invention provide for a first predefined initial parameter of the waveform model to be that the waveform is sinusoidal; and for a second predefined initial parameter of the waveform model to be that the waveform model has an initial frequency which is set equal to a breathing rate of a subject to be imaged. The waveform model may transition to a second, lower frequency sinusoid for a final exhalation portion of each breathing cycle of the subject so as to more accurately model the respiration-induced motion at the end of the subject's exhalation.

Still further features of the invention provide for a control system to be provided into which the sequence of navigator samples are input and which is configured to have the waveform model of predefined initial parameters as its output, the control system being operable to adjust the waveform model by:

computing a feedback error equal to the difference between the navigator samples and the output, and providing the feedback error as an input to the control system, the output of the control system thereby converging upon the sequence of navigator samples so that the waveform model mimics the actual displacement of the structure caused by the respiratory motion.

Yet further features of the invention provide for the waveform model to be extrapolated by setting the feedback error equal to zero during the second time interval so that the output of the control system completely follows the waveform model during the second time interval.

Further features of the invention provide for the structure to be a beating heart of a subject; for the segments to be taken during approximately the same interval during several consecutive cardiac cycles; for the timing of the segments to be triggered by an ECG trigger signal; and for the navigator readings to be based on the detected position of a right hemi diaphragm of the subject.

Still further features of the invention provide for the first time interval to commence after the occurrence of a heartbeat as indicated by the ECG trigger signal; and for the first and the second time interval to occur within one cardiac cycle.

Yet further features of the invention provide for the navigator samples to be positioned approximately 100 ms apart; for about 5 navigator samples to occur during the first time interval; and for up to 25 image projection lines to be taken during the imaging segment.

The invention extends to a method of obtaining a magnetic resonance image of a structure cyclically displaced by respiration-induced motion using a magnetic resonance scanner, comprising the steps of:

in a first time interval:
obtaining from the magnetic resonance scanner a sequence of navigator samples representative of the progressive displacement of the structure; and
adjusting a waveform model of predefined initial parameters to follow the sequence of navigator samples;

in a second time interval which follows the first time interval:
estimating the expected displacement of the structure by extrapolating the waveform model; and
taking an image segment composed of a number of image projection views or lines, the position at which at least some of the image projection lines are taken being adjusted based on the estimated displacement of the structure at the time that such image projection lines are taken;

and subsequently, combining the image projection lines to form a magnetic resonance image.

Further features of the invention provide for a first predefined initial parameter of the waveform model to be that the waveform is sinusoidal; and for a second predefined initial parameter of the waveform model to be that the waveform model has an initial frequency which is set equal to a breathing rate of a subject to be imaged. The waveform model may transition to a second, lower frequency sinusoid for a final exhalation portion of each breathing cycle of the subject so as to more accurately model the respiration-induced motion at the end of the subject's exhalation.

Still further features of the invention provide for the structure to be a beating heart of a subject; for the segments to be taken during approximately the same interval during several consecutive cardiac cycles; for the timing of the segments to be triggered by an ECG trigger signal; and for the navigator readings to be based on the detected position of a right hemi diaphragm of the subject.

BRIEF DESCRIPTION OF THE DRAWINGS

The invention will now be described, by way of example only with reference to the accompanying representations in which.

DETAILED DESCRIPTION WITH REFERENCE TO THE DRAWINGS

Figure 1:
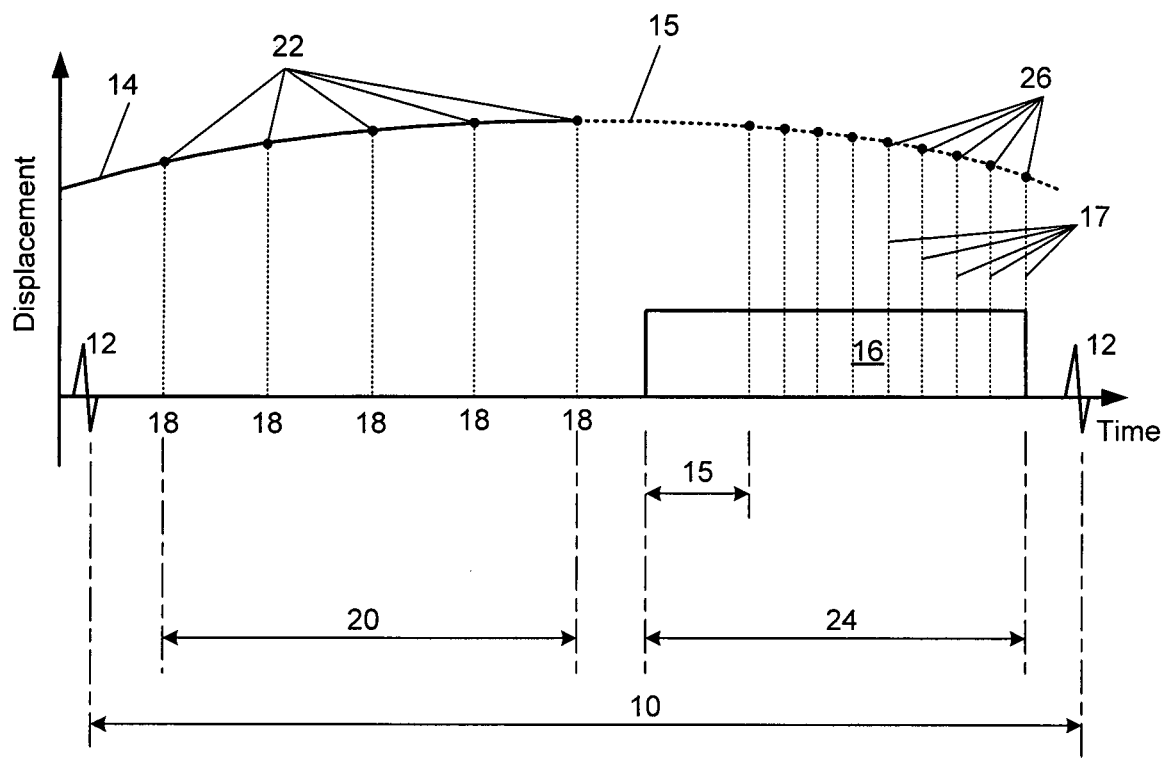
FIG. 1 is a graph showing a single cardiac cycle during which an imaging segment is taken and the method of the invention is employed.

FIG. 1 is a graph illustrating a method for compensating for respiration-induced motion of a subject's heart as it is imaged by a magnetic resonance (MR) scanner. The horizontal axis represents time and the graph is shown over one cardiac cycle (10) which spans a pair of consecutive heartbeats (12). The vertical axis represents the displacement of the subject's heart that occurs due to the subject breathing.

Image preparation and acquisition by the MR scanner is done during a segment (16) which is gated by an ECG trigger signal which detects the heartbeats (12) so as to occur at the same time during consecutive cardiac cycles. For a healthy subject with a resting heart rate of about 70 beats per minutes, the imaging segment (16) can be about 200 ms long, which includes a scanner preparation period (15) followed by an imaging sequence during which about 25 image projection views or lines (17) can be obtained during the single cardiac cycle.

The movement of the subject's heart due to respiration is determined by measuring the movement of the subject's diaphragm, since there is in most cases a predictable relationship between the two. The movement of the diaphragm is measured by periodic navigator projections (18) generated by a scanning sequence made by the MR scanner prior to each segment and which excites a narrow line across the subject's right hemi diaphragm. In this embodiment, a navigator repeat time of approximately 100 ms is used, enabling five navigator samples (22) to be acquired prior to the imaging segment. It will be appreciated that navigator samples (2) are not available during the imaging segment (16) because the MR scanner is then being used to acquire the image projection views or lines (17).

In the method of the invention, the sequence of navigator samples (22) is obtained during a first time interval (20) and a waveform model (14) of predefined initial parameters is fitted to the sequence of navigator samples. During a second time interval (24) in which the imaging segment is taken, the expected displacement (26) of the diaphragm is estimated for at least some of the image projection lines taken during the segment by extrapolating the waveform model as indicated by the dotted line (15). The position at which each image projection line is taken is then adjusted based on the expected displacement of the diaphragm at time at which that image projection line is taken as predicted by the extrapolated waveform (15), so that the image projection lines taken of the heart are equally spaced and adjacent each other relative to the heart, and an image slice can be constructed with less blurring.

Figure 2:
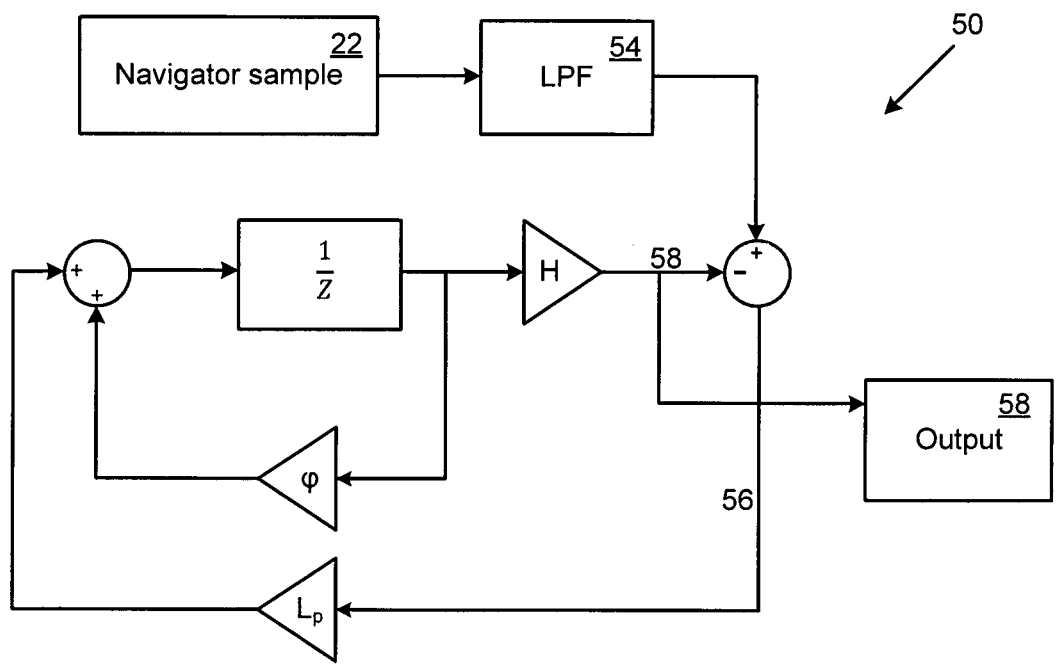
FIG. 2 is a schematic diagram of a control system used in the method of the invention.

The waveform prediction model for extrapolating the waveform (14) is implemented by means of a control system (50) shown in FIG. 2. In the control system, the sequence of navigator samples (22) are input into the control system after they have been passed through a low-pass filter (54) to remove noise that may be caused by occasional wrong edge outputs. The control system has a waveform model of predefined initial parameters as its output (58). A feedback error (56) is then computed by the control system as the difference between the input navigator samples and the output, and the feedback error is provided as an input to the control system after being multiplied by a feedback gain ($L_p$). By means of this feedback arrangement, the output (58) converges on the navigator samples, thereby adjusting the waveform model to mimic the actual displacement of the structure caused by the respiratory motion.

The first step in designing the control system is selecting the waveform type that best models the actual respiratory displacement of a subject's diaphragm over time. Various different waveform types were tested, and one appropriate waveform was found to be a simple sinusoidal wave. The basic control system dynamics can therefore be described as:

$$f(kT_s) = \sin(akT_s) \tag{1}$$

where a is the frequency and $T_s$ is the period of the sampling in seconds.

The next initial parameter of the waveform that must be chosen is the frequency of the waveform. This is set to be equal to the breathing rate of the subject to be imaged. The breathing rate is determined from a short period of diaphragm monitoring at the start of an MR scan.

The frequency can be expressed as:

$$a = 2\Pi\omega \tag{2}$$

The Laplace transform of (1) yields $$F(s) = \frac{a}{s^2 + a^2} \tag{3}$$

which gives a continuous state space model with:

$$F = \begin{bmatrix} 0 & -a^2 \\ 1 & 0 \end{bmatrix} \tag{4}$$

H is the output gain of the system and is chosen to be:

$$H = [1\ 0] \tag{5}$$

The discrete state space model for the control system can be then expressed by known methods as:

$$\Phi = \begin{bmatrix} 1 & -a^2 T \\ T & 1 \end{bmatrix} \tag{6}$$

The next step in designing the control system is to place the poles. The placement of the poles determines the feedback gain ($L_p$), which defines how fast the output converges to the sequence of navigator samples (the plant state). Since there are only 5 samples available prior to the imaging segment during which the waveform model must converge on the plant state, the poles are chosen so that the system converges quickly. During an iterative testing process, it was found that poles placed at Z=0.265±j 0.25454 during the first interval (20) ensured fast convergence to the plant's state. The relationship between the feedback gain ($L_p$) and the placed poles can be determined by well known methods by the following steps:

$$z_{est} = \text{placed poles} = \text{real} \pm j\ \text{imaginary} = z_{estR} \pm jz_{estI} \tag{7}$$

By factorizing, the following relationships are obtained:

$$Z_{est1} = -2Z_{estR} \tag{8}$$

$$Z_{est2} = Z_{estR}^2 + Z_{estI}^2 \tag{9}$$

from which the following can be derived:

$$L_{p1} = -z_{est1} + 2 \tag{10}$$

$$L_{p2} = \frac{a^2 T^2 - z_{est2} + 1 - L_{p1}}{a^2 T} \tag{11}$$

Importantly, during the imaging segment when no navigator data is available, the poles are switched by setting the feedback gain ($L_p$) to zero so that the output (58) completely follows the waveform model. The output is then up-sampled by means of linearization to the same rate as the echo spacing so that one sample of the waveform model is taken at the time each image projection line is made. These samples then represent the estimated respiratory displacement of the heart at the time the image projection lines are made. The estimated displacement of each sample is used to adjust the position of the lines of excitation taken by the MRI scanner so as to correct the position of the image projection lines as they are taken to yield a sharper image.

Testing of the Control System

The control system was tested on 8 healthy volunteers to determine its accuracy in predicting actual diaphragm displacement. First, the control system was provided initial parameters of a sinusoidal wave with a frequency of 0.4 Hertz. A navigator repeat time of 100 ms was chosen and the system sequence was set to accept 5 navigator samples and to then predict the waveform until the next ECG trigger was received. The test was run for 150 seconds on each volunteer, with the first 30 seconds not being recorded to allow the system to stabilise.

Figure 3A:
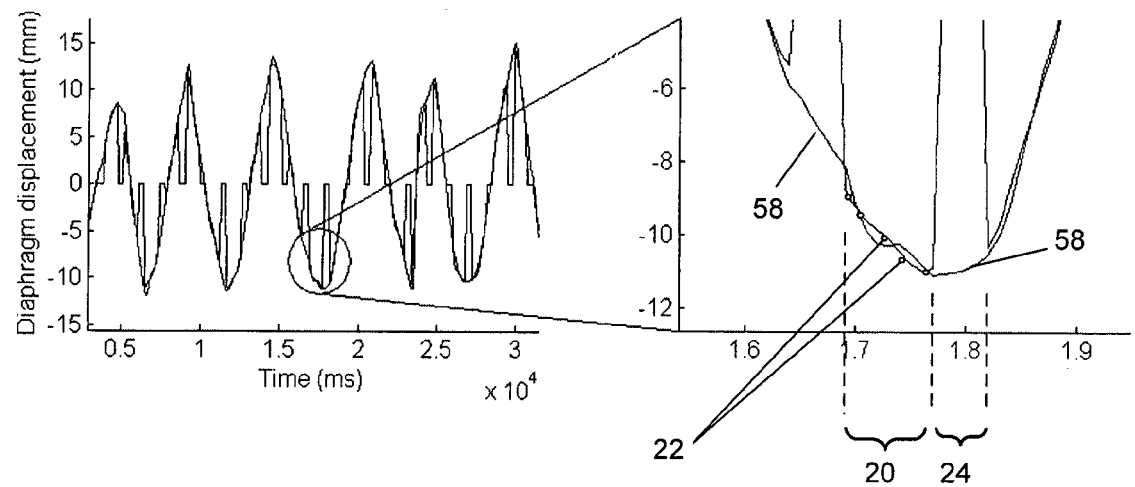
FIG. 3A is a graph of navigator data and the control system output in a test of a first volunteer.
Figure 3B:
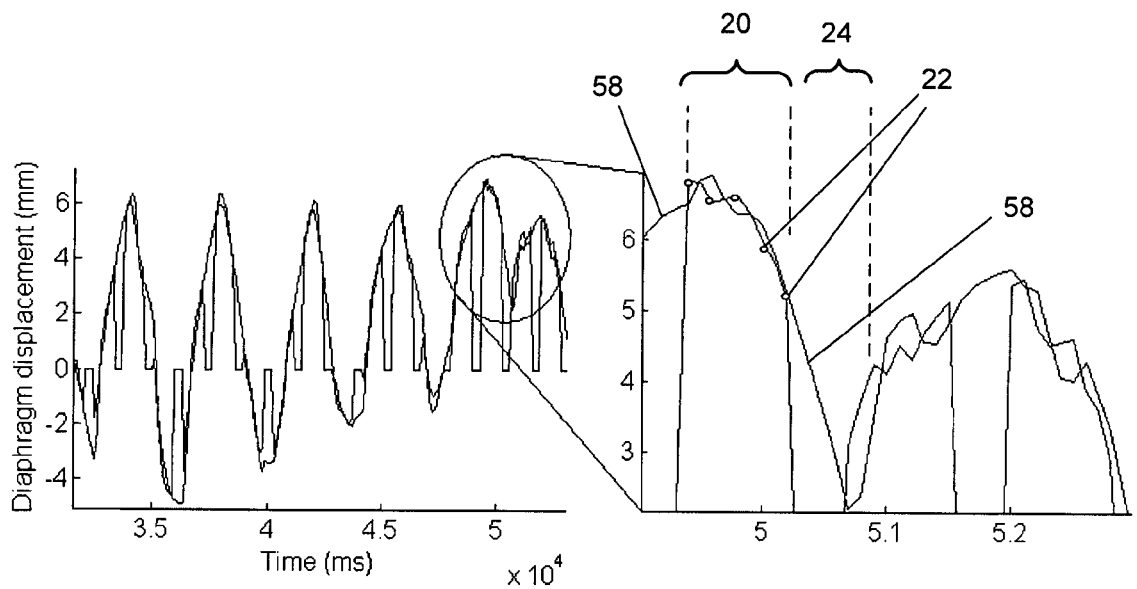
FIG. 3B is a graph of navigator data and the control system output in a test of a second volunteer.

FIGS. 3A and 3B show graphs of the stabilised results for two of the volunteers over several breathing cycles. As shown in the magnified sections of the figures, five navigator samples (22) were obtained during a first time interval (20) and the output (58) of the control system quickly converged on these samples during the first time interval. During a second time interval (24), no navigator samples were available and the output (58) of the control system followed the control system's sinusoidal model until the next ECG trigger signal occurred at the end of the second time interval (24), after which the process repeated itself.

The accuracy of the system was then calculated by comparing the first navigator sample of the next cardiac cycle with the predicted value at that point in time, which will be the maximum error deviation of the predicted values for a given cardiac cycle. The average RMS error over the test period for the 8 volunteers was found to be as follows:

TABLE 1

Root Mean Squared (RMS) error and diaphragm range for eight volunteers

| Volunteer | 1 | 2 | 3 | 4 | 5 | 6 | 7 | 8 |
|---|---|---|---|---|---|---|---|---|
| RMS error (mm) | 0.66 | 0.91 | 0.66 | 0.55 | 0.62 | 0.82 | 0.71 | 0.49 |
| Diaphragm range (mm) | 14.25 | 15.58 | 11.80 | 15.22 | 16.16 | 17.27 | 13.38 | 12.53 |

The mean RMS error of the 8 scans was 0.68 mm.

Testing in an MR Scanner

The complete system was tested in an MRI scanner by using a phantom that moved in periodic breathing-like manner with amplitude of about 30 mm. The phantom was a water-filled Perspex box mounted on moveable cart in the MRI scanner which had a cord extending to the MRI control room for controlling the motion. The ECG was set to 1,000 ms, the navigator repeat time to 100 ms and the imaging segment set from 700 ms to 900 ms.

The following tests were performed:
1. A scan of a stationary phantom with no motion compensation for use as a control reference (200);
2. A scan of a moving phantom using the motion compensation of the invention (202);
3. A scan of a moving phantom with no motion correction (204).

Figure 4A:
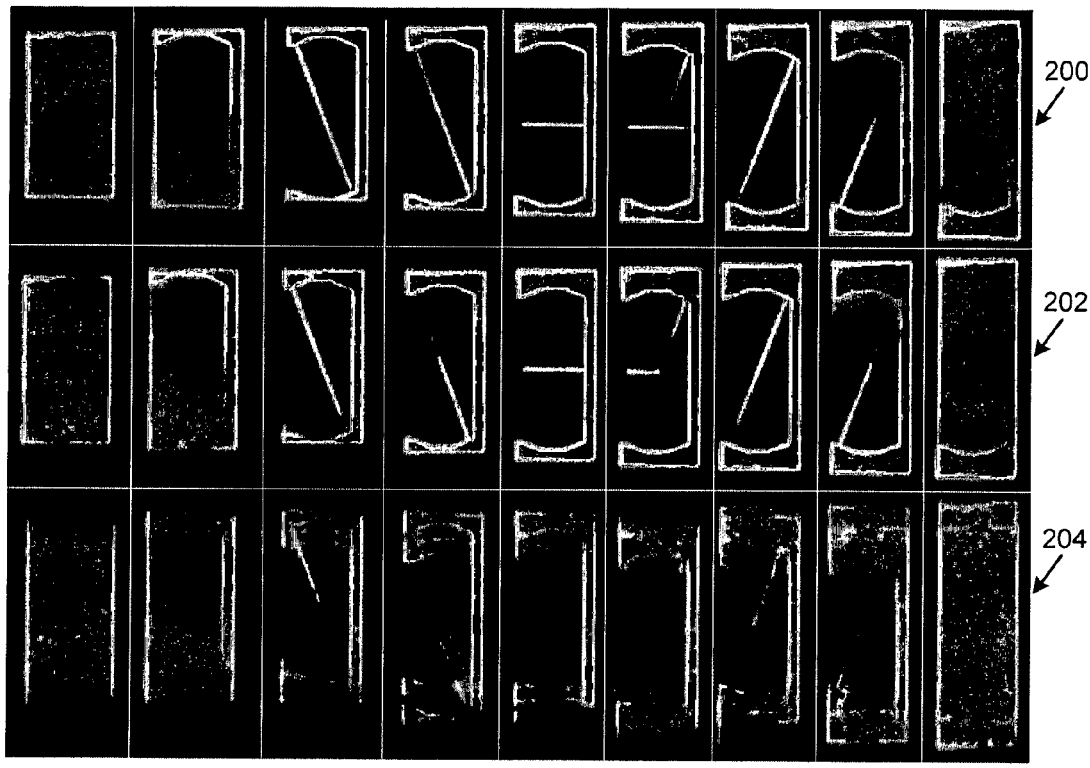
FIG. 4A shows a series of magnetic resonance images produced during three different tests.
Figure 4B:
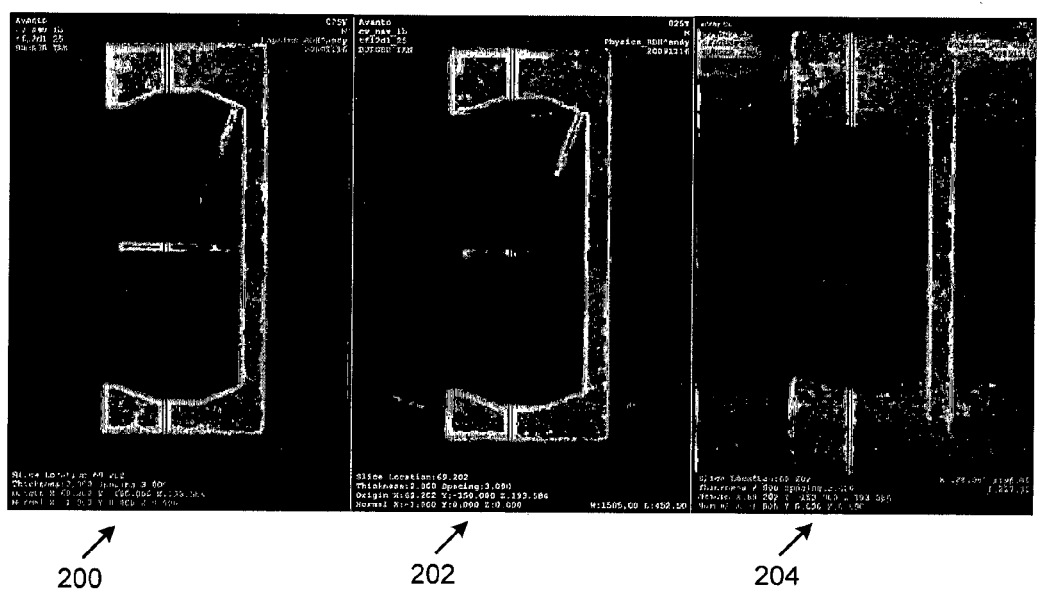
FIG. 4B is a detail view of one of the image slices produced in each of the three tests in FIG. 4A.

The magnetic resonance images (200, 202, 204) produced by the three tests are shown in FIGS. 4A and 4B. FIG. 4A shows the various slices produced by the MR scanner for the three different tests, while FIG. 4B shows the middle slices produced by the three tests in more detail.

Figure 5:
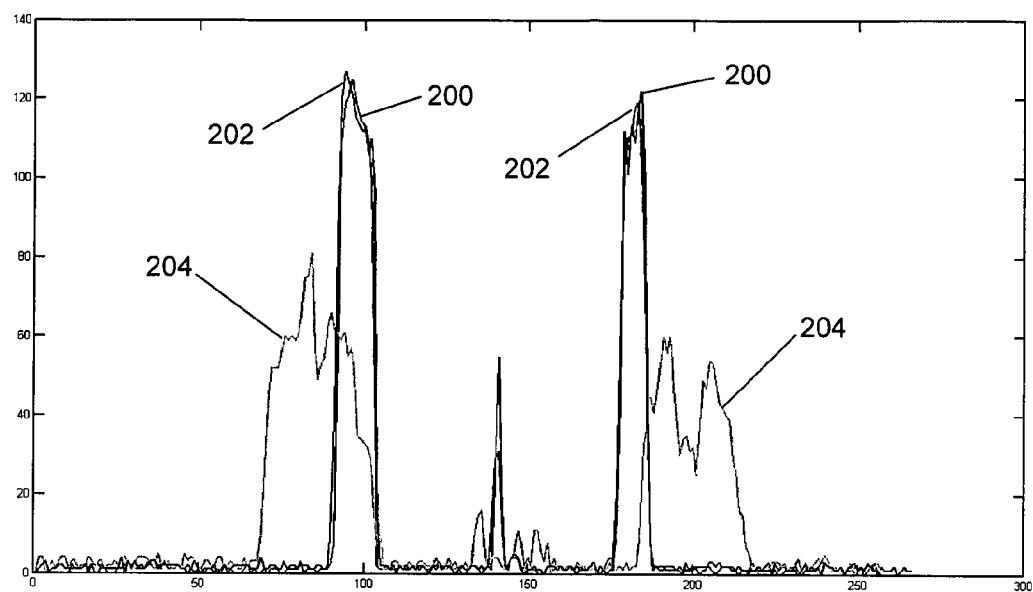
FIG. 5 is a graph representing the edge sharpness of the images of FIG. 4B.

FIG. 5 is a graph representing the edge sharpness by reading the contrast of a single line of the image of the three images (200, 202, 204) produced in FIG. 4B. As can clearly be seen, the graph of the image in which the motion compensation was employed (202) closely approximates the control image (200), while the graph of the image in which no motion compensation was employed (204) is very different from the control image as evidenced by the blurriness of that image in FIG. 4B.

Figure 6:
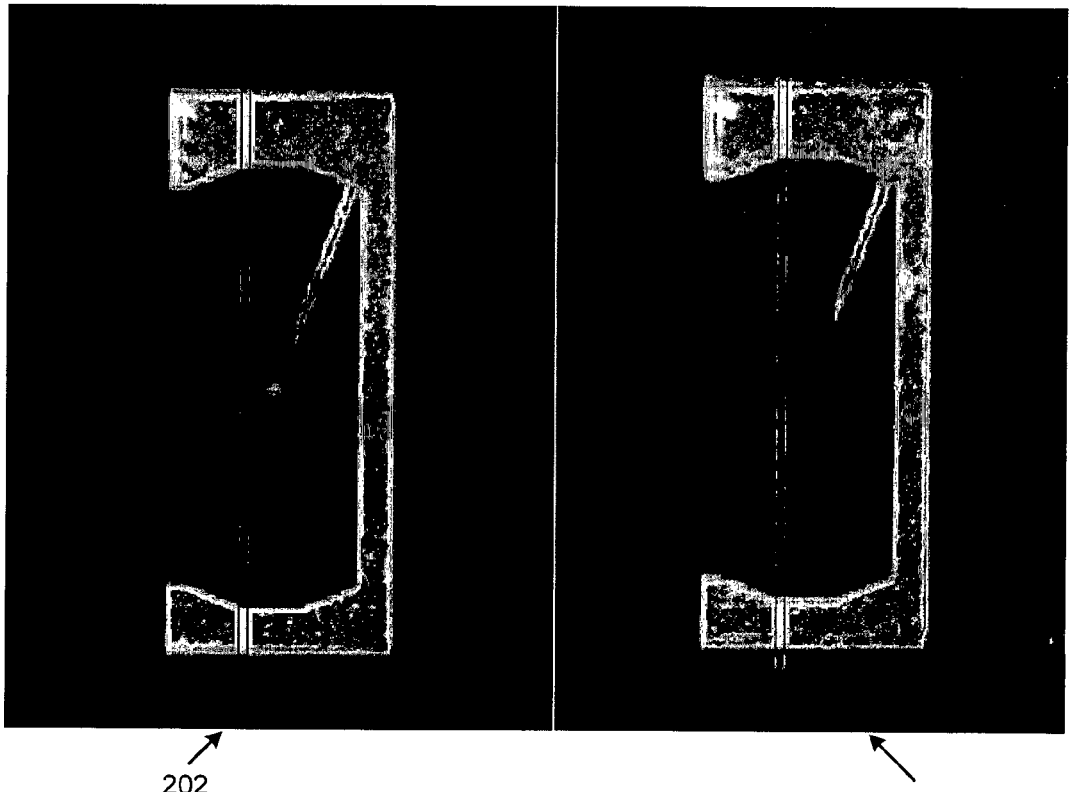
FIG. 6 shows the image obtained when the motion compensation method of the invention is employed as compared with the image obtained when the accept-reject algorithm with a 5 mm acceptance window is employed.
Figure 7A:
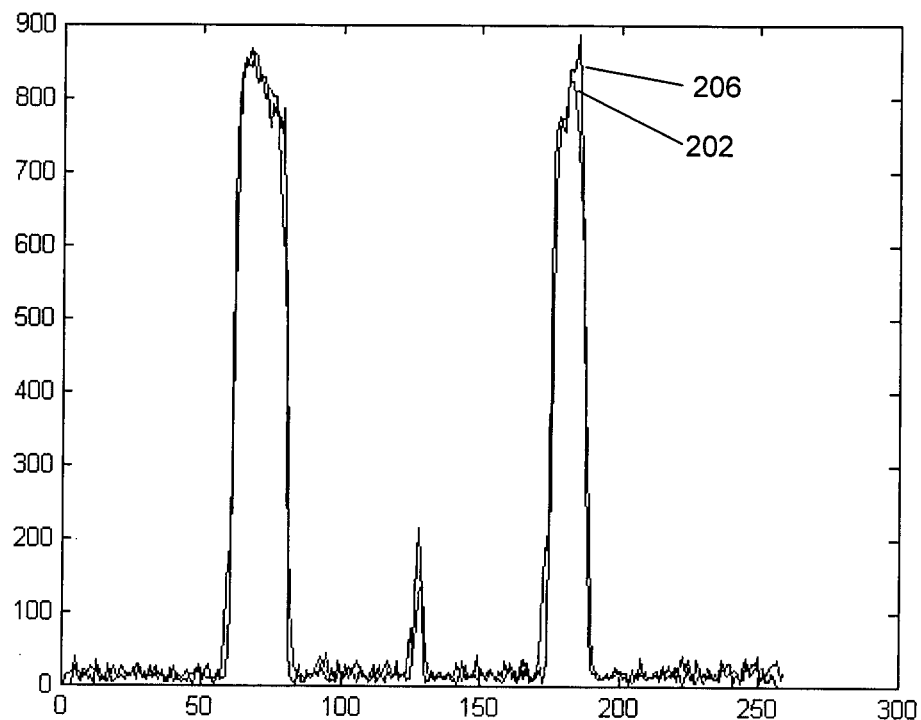
FIG. 7A is a graph representing the edge sharpness of the images shown in FIG. 6.
Figure 7B:
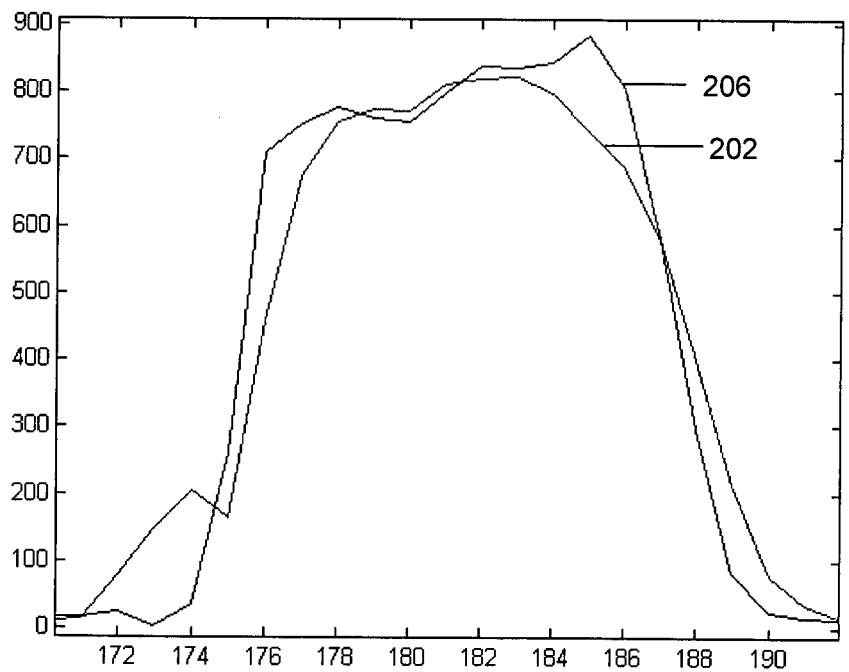
FIG. 7B is a detail view of a portion of the graph of FIG. 7A.

A further test was then conducted to compare the results of the motion compensation method of the invention with the accept-reject algorithm with a 5 mm acceptance window. FIG. 6 illustrates the image obtained when the motion compensation method of the invention was used (202) as compared with the image obtained when the accept-reject algorithm with a 5 mm acceptance window was used (206). FIG. 7A shows the graph of the two images and FIG. 7B shows a detail view of a portion of the graph of FIG. 7A. As can be seen in FIG. 7B, the graph of the image resulting from the technique of the invention (202) is slightly narrower (and hence sharper) than the graph of the image resulting from the accept-reject algorithm (206).

The tests therefore indicate that the method of the invention performs at least as well as the accept-reject algorithm with a 5 mm acceptance window. Importantly, however, because image segments can be taken during every cardiac cycle and not just those cycles in which the diaphragm is within an acceptance window, scan times using the method of the invention can be reduced by up to half as compared to scan times required using the accept-reject algorithm.

Testing of a More Complex Waveform Model

Although the simple sinusoidal waveform model of equation (1) was found to yield satisfactory results, in cases where subjects paused at the end of exhaling, the prediction error in using a simple sinusoidal waveform was found to increase. To correct for this, a two-part waveform model was tested having the form:

$$f(kT_s) = \begin{array}{l} \sin(a_1 kT_s) \,|\, t_1 < T < t_2 \\ \sin(a_2 kT_s) \,|\, t_2 < T < t_1 \end{array} \quad (12)$$

with $$a_2 = a_1 \times 1.25 \quad (13)$$

Where $T_s$ is the sample rate, $a_1$ is the frequency of the breathing/oscillation and $a_2$ the adjusted frequency to fit the model to the breathing signal near the end of an exhalation. The waveform model switches from $a_1$ to $a_2$ when the input approaches the end of an exhalation at $t_2$.

To compare the simple sinusoidal model of equation (1) to the two-part waveform model of equation (12), breathing data was recorded for six subjects. The subjects were placed in the MR scanner for 3 minutes while breathing freely. Navigator signals were acquired every 200 ms in order to measure displacement due to breathing, and the data was interpolated using the Lagrangian interpolation to increase the samples to 100 ms intervals.

Figure 8A:
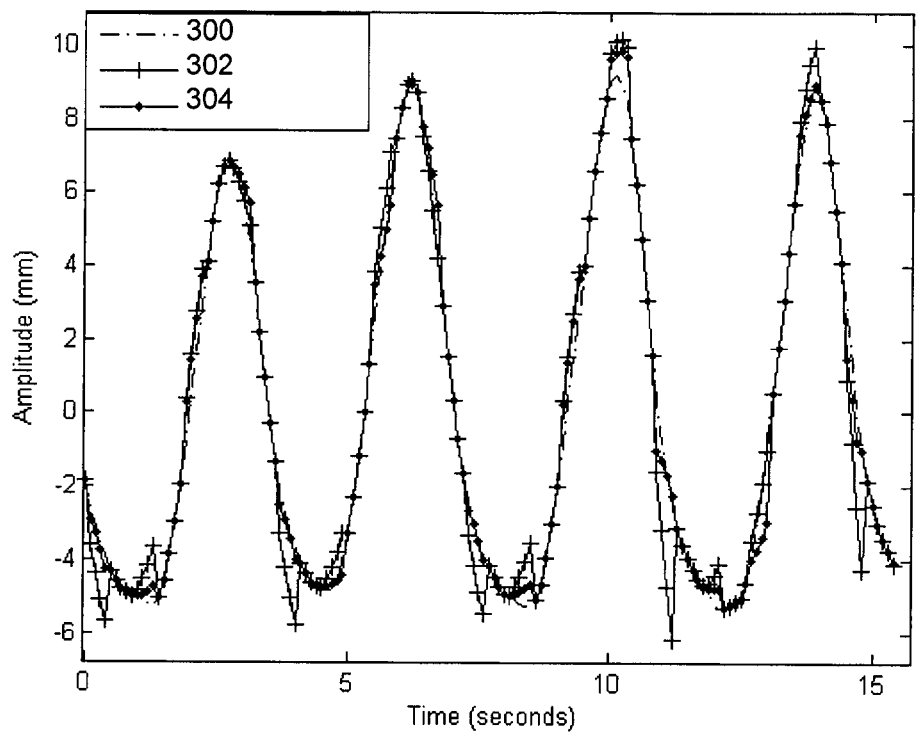
FIG. 8A is a graph showing the output of a simple sinusoidal waveform model and a two-part sinusoidal model compared to the respiratory-induced motion of a structure in a subject.
Figure 8B:
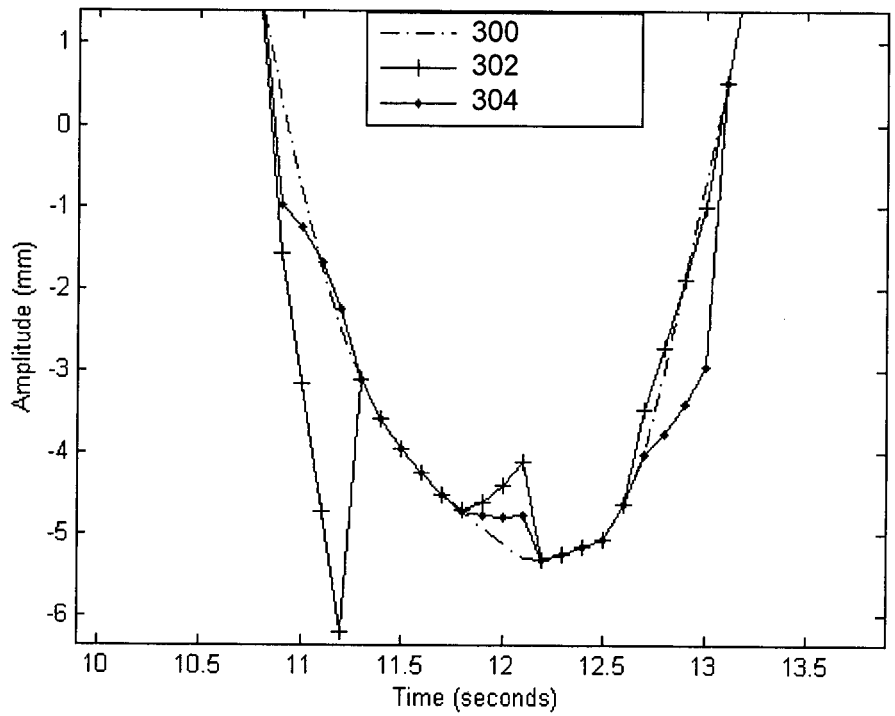
FIG. 8B is a detail view of a portion of the graph of FIG. 8A.

In a simulation the control system sample rate was also set to 100 ms and the cardiac cycle length to 900 ms, with 5 navigators followed by 4 predicted samples. FIG. 8A shows a graph of the actual breathing displacement waveform of a subject (300), the predicted waveform using the single sinusoidal waveform model (302) of equation (1), and the predicted waveform using the two-part sinusoidal waveform model (304) of equation (12). FIG. 8B shows a detail view of the portion between 10.5 s and 13.5 s in FIG. 8A. As can be seen from FIGS. 8A and 8B, the two-part sinusoidal waveform model (304) more closely follows the actual breathing waveform (300) of the subject at the end of a subject's expiration, as shown at about 3.5 s, 7.5 s, 11.25 s and 15 s in FIG. 8A and at 11.25 s in FIG. 8B.

To compare the two waveform models quantitatively, the Root Mean Square (RMS) error was obtained for each waveform for the 6 different subjects. The RMS error was then divided by the maximum amplitude of the breathing signal and multiplied by 100 to express the RMS error as a percentage of the amplitude. The following results were obtained:

TABLE 2

Comparison of Root Mean Squared (RMS) error for simple
sinusoidal and two-part sinusoidal waveform models for 6 subjects

| Subject | Breathing frequency (Hz) | Maximum amplitude of breathing signal (mm) | RMS error with one sine wave (%) | RMS error with two sine waves (%) |
|---|---|---|---|---|
| 1 | 0.27 | 10.20 | 4.12 | 2.45 |
| 2 | 0.41 | 10.50 | 4.00 | 2.76 |
| 3 | 0.29 | 13.25 | 3.77 | 2.11 |
| 4 | 0.31 | 11.40 | 5.09 | 3.07 |
| 5 | 0.13 | 26.55 | 1.92 | 1.47 |
| 6 | 0.36 | 5.70 | 5.96 | 3.86 |

Figure 9:
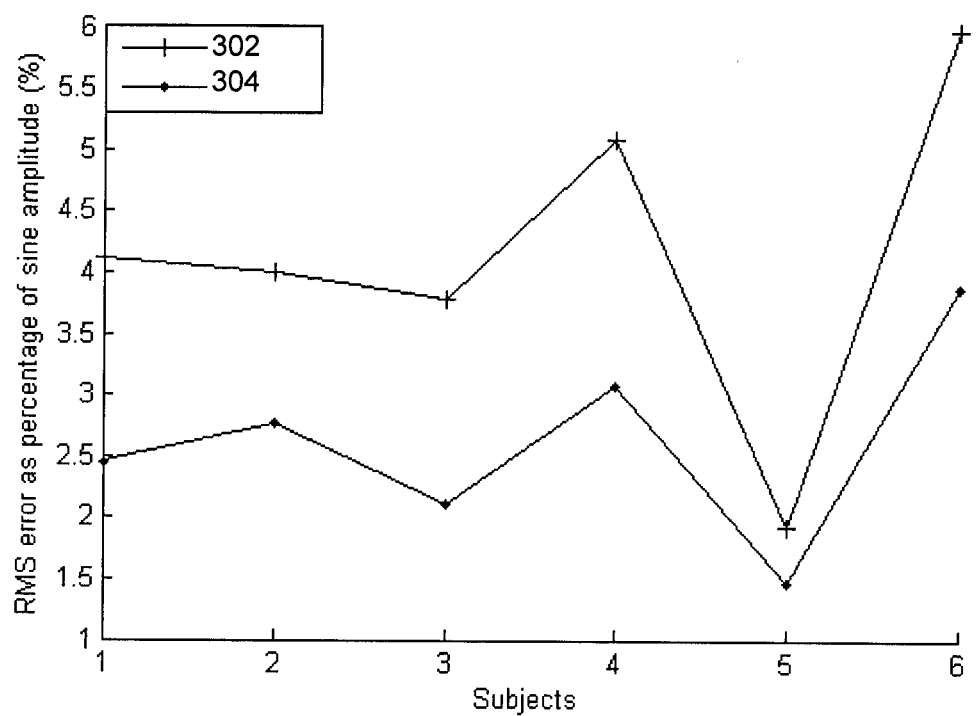
FIG. 9 is a graph comparing the RMS error of the simple sinusoidal waveform model and two-part sinusoidal waveform model in predicting respiratory-induced motion for six different subjects.

FIG. 9 is a graph illustrating the results of the last two columns of Table 2. As can be seen from FIG. 9, the two-part sinusoidal waveform model of equation (12) yields lower RMS errors than the simple sinusoidal waveform model of equation (1) across a wide range of breathing frequencies and amplitudes.

Although two different waveform models have been disclosed, it will be appreciated that many other waveform models may be appropriate in modelling the breathing of a subject, and that the same waveform model need not be used for all subjects. Prior to scanning, a subject's breathing could be monitored for a period and a determination made as to the most appropriate waveform model to be used. It will also be appreciated that external means for influencing a subjects breathing could be employed, such as a timing device of sorts which is subject is requested to follow in his or her breathing pattern, the timing device enabling the waveform model to more closely follow the subject's breathing pattern. Many other variations may be made which fall within the scope of the invention.

The invention therefore provides a method for compensating for respiratory motion in magnetic resonance imaging of structures that are affected by respiratory motion, particularly the heart, and allows a subject to breathe normally during imaging while enabling appreciably shorter scan times than existing methods of comparable effectiveness.

The invention claimed is:

1. A method for compensating for respiration-induced motion of a structure imaged by a magnetic resonance scanner, comprising the steps of: in a first time interval:
   obtaining from the magnetic resonance scanner a sequence of navigator samples representative of a progressive displacement of the structure; and
   adjusting a waveform model of predefined initial parameters to follow the sequence of navigator samples;
   in a second time interval which follows the first time interval and during which the magnetic resonance scanner takes an imaging segment composed of a number of image projection views or lines:
   estimating an expected displacement of the structure at the times at which at least some of the image projection lines are taken by extrapolating the waveform model and estimating displacements predicted by the extrapolated waveform model; and
   adjusting a position at which at least some of the image projection lines are taken based on the estimated displacement of the structure at the time that those image projection lines are taken;
   wherein the predefined initial parameters of the waveform model include that the waveform model is sinusoidal and has an initial frequency approximately equal to a breathing rate of a subject to be imaged;
   providing a control system into which the sequence of navigator samples is input and which is configured to have the waveform model of predefined initial parameters as its output, the control system being operable to adjust the waveform model by: computing a feedback error equal to the difference between the navigator samples and the output, and providing the feedback error as an input to the control system, the output of the control system thereby converging upon the sequence of navigator samples so that the waveform model mimics the actual displacement of the structure caused by the respiration-induced motion.

2. The method as claimed in claim 1 in which the waveform model transitions to a second, lower frequency sinusoid for a final exhalation portion of each breathing cycle of the subject so as to more accurately model the respiration-induced motion at the end of the subject's exhalation.

3. The method as claimed in claim 1 in which the waveform model is extrapolated by setting the feedback error equal to zero during the second time interval so that the output of the control system completely follows the adjusted waveform model during the second time interval.

4. The method as claimed in claim 1 in which the structure is a beating heart of the subject and the imaging segments are taken during approximately the same interval during several consecutive cardiac cycles.

5. The method as claimed in claim 4 in which the timing of the imaging segments is triggered by an electrocardiogram ECG trigger signal and the navigator readings are based on a detected position of a right hemi diaphragm of the subject.

6. The method as claimed in claim 5 in which the first time interval commences after the occurrence of a heartbeat as indicated by the ECG trigger signal, and the first and the second time interval occur within one cardiac cycle.

7. The method as claimed in claim 1 in which the navigator samples are positioned approximately 100 ms apart, 5 navigator samples occur during the first time interval, and up to 25 image projection views or lines are taken during the imaging segment.

* * * * *